United States Patent [19]

Naitoh et al.

[11] Patent Number: 4,766,320
[45] Date of Patent: Aug. 23, 1988

[54] APPARATUS FOR ION IMPLANTATION

[75] Inventors: Masao Naitoh; Tomoji Ogawa, both of Kyoto, Japan

[73] Assignee: Nissin Electric Company, Ltd., Kyoto, Japan

[21] Appl. No.: 835,952

[22] Filed: Mar. 4, 1986

[30] Foreign Application Priority Data

Mar. 8, 1985 [JP] Japan .................................. 60-46755

[51] Int. Cl.$^4$ .......................................... H01J 37/317
[52] U.S. Cl. .................................. 250/492.2; 250/398; 250/281
[58] Field of Search ............. 250/492.2, 492.21, 492.3, 250/396 R, 398, 281, 298

[56] References Cited

U.S. PATENT DOCUMENTS

| | | | |
|---|---|---|---|
| 4,254,340 | 3/1981 | Camplan et al. | 250/492.2 |
| 4,315,153 | 2/1982 | Vahrenkamp | 250/396 R |
| 4,383,180 | 5/1983 | Turner | 250/492.2 |
| 4,560,879 | 12/1985 | Wu et al. | 250/492.2 |
| 4,584,473 | 4/1986 | Hashimoto et al. | 250/251 |
| 4,595,837 | 6/1986 | Wu et al. | 250/492.2 |

FOREIGN PATENT DOCUMENTS 0071546  4/1983  Japan ................................ 250/492.2

OTHER PUBLICATIONS

Low Energy Ion Beam Formation for Film Formation—S. C. Cheng, I. Yamada and T. Takagi, Ion Beam Engineering Lab—Kyoto University.

Primary Examiner—Bruce C. Anderson
Assistant Examiner—Paul A. Guss
Attorney, Agent, or Firm—Sandler & Greenblum

[57] ABSTRACT

An ion implantation apparatus comprising an ion source, extraction electrode, mass separator, deceleration tube, ion implantation unit, and a suppressor electrode disposed in the deceleration tube in the vicinity of its inlet for suppressing flow of secondary electrons produced in the separator into the deceleration tube. The secondary electrons are inhibited from flowing into the implantation unit along with ions.

17 Claims, 2 Drawing Sheets

APPARATUS FOR ION IMPLANTATION

BACKGROUND OF THE INVENTION

1. Field of the Invention

The present invention relates to improvements in apparatus for low energy ion implantation.

2. Description of the Prior Art

Low energy ion implantation apparatus are known which are of the type disclosed in "Low Energy Ion Beam Formation for Film Formation," Proceedings of the Fifth Symposium on Ion Sources & Ion Asisted Technology, June 1981. With the apparatus of this type, the ions emitted from an ion source and passing through a mass separator are further passed through a deceleration tube and thereby decelerated. In this case, the energy of the ion beam reaching a disk having thereon the workpiece to be ion-implanted is given by the deceleration voltage of a deceleration power supply. Accordingly, the deceleration voltage, when set to a desired low level, affords an ion beam of low energy.

With such an ion implantation apparatus, however, ions of masses other than the desired mass impinge on the inner wall of the mass separator to produce a large amount of secondary electrons. The secondary electrons moving into the deceleration tube from the interior of the mass separator are subjected to a positive force within the deceleration tube and thereby acclerated in the direction of advance of the ion beam to form a stream of secondary electrons. This stream of secondary electrons strikes the disk with high energy emitted by the extraction power supply voltage minus the deceleration voltage (i.e., the voltage between the opposite ends of the deceleration tube). Consequently, the secondary electrons influence the measurement of the beam current of the ion beam. Moreover, the amount of secondary electrons varies with the course of the ion beam.

The influence exerted by the high velocity secondary electrons, that is, the high energy secondary electrons on the measurement of the beam current is slight in ion implantation apparatus having a medium or lower ion beam current (for example of up to about 1 mA). However the influence becomes pronounced with high current apparatus wherein the amount of secondary electrons is inevitably greater. Thus, in high current apparatus it becomes difficult to accurately measure the ion beam current. Further if it is impossible to accurately measure the ion beam current, difficulties will be encountered in adjusting the amount of ion beam current and in assuring the implantation of an accurate amount of ions based on the measurement.

SUMMARY OF THE INVENTION

The present invention provides an apparatus for ion implantation including an ion source, an ion extraction electrode opposed to the ion source, an ion extraction power supply. The apparatus further includes a mass separator for passing desired ions as selected from among the ions extracted from the ion source by the extraction electrode, a deceleration tube for decelerating and passing therethrough the ions from the mass separator, and an ion deceleration power supply. Also included is an ion implantation unit for implanting the ions from the deceleration tube into the article to be treated, a suppressor electrode disposed within the deceleration tube in the vicinity of an ion inlet thereof for suppressing the flow of secondary electrons into the deceleration tube, and a suppressor power supply for the suppressor electrode.

With the apparatus of the present invention, exposure to secondary electrons is prevented when the desired ion beam is implanted, and the ion beam current can be measured accurately at all times.

The accurate measurement of the beam current assures accurate ion implantation control for producing ion-implanted articles of high quality.

DESCRIPTION OF THE PREFERRED EMBODIMENT

Figure 1:
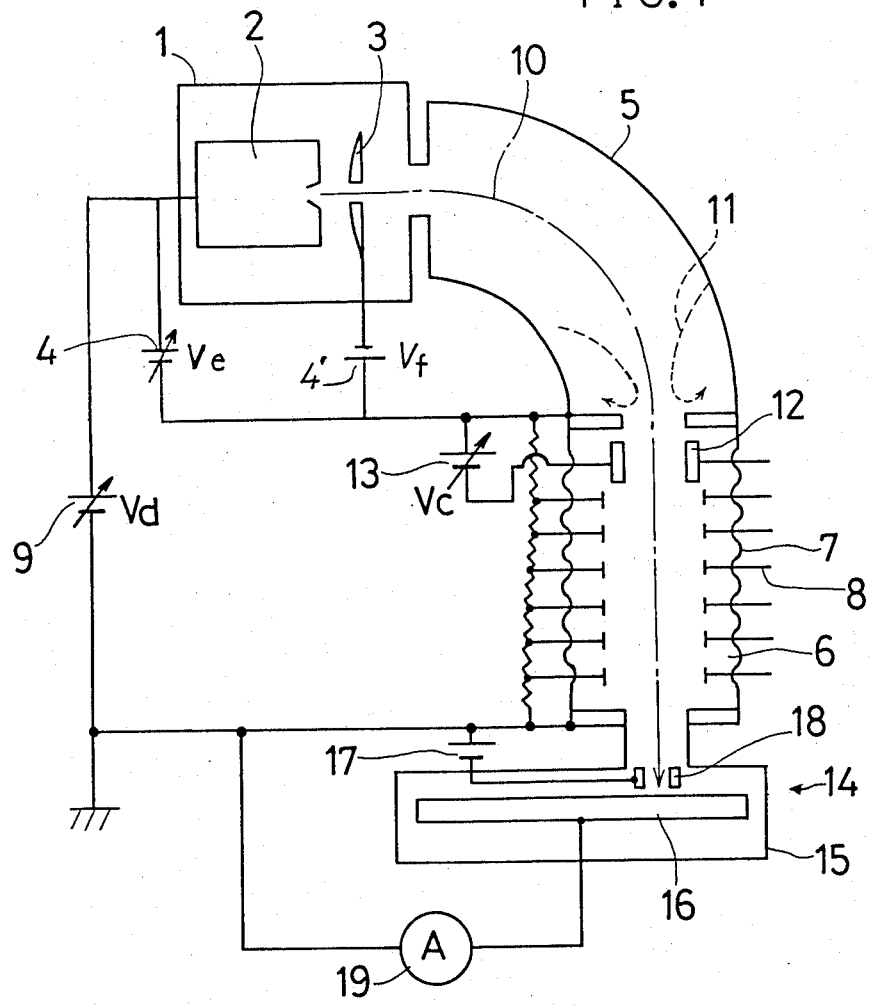
FIG. 1 is a diagram schematically showing an ion implantation apparatus embodying the present invention.

The entire ion implantation apparatus of the present invention is adapted to successively effect production, mass separation, deceleration and implantation of ions. The apparatus comprises an ion source and an ion extraction electrode which provide an ion production unit, a mass separator serving as a mass separation unit, a deceleration tube serving as a deceleration unit, and a vacuum container providing an ion implantation unit.

These components can be those generally used for ion implantation apparatus.

According to the present invention, a suppressor electrode for secondary electrons is disposed within the deceleration tube in the vicinity of its ion inlet. A suppressor power supply connected to the suppressor electrode applies a negative voltage to the suppressor electrode, which suppresses the flow of secondary electrons into the deceleration tube although these electrons act to flow into the tube from the mass separator along with ions.

The suppressor electrode is, for example, in the form of a hollow cylinder and is disposed within the deceleration tube concentrically therewith in the vicinity of its ion inlet. The hollow cylinder, when used, needs to have a length enabling the cylinder to fully serve the secondary electron suppressing function. The suppressor power supply may be adapted to apply a variable voltage to give the suppressor electrode the function of adjusting the degree of suppression of secondary electrons.

While an embodiment of the present invention will be described below in greater detail with reference to the drawings, the invention is not limited to the embodiment.

An ion production unit 1 has in its interior an ion source 2 and an ion extraction electrode 3 opposed to the ion source 2. The ion extraction power supplies 4 and 4' apply a voltage across the ion source 2 and the electrode 3. A mass separator 5, which is in a bent form, has a starting end connected to the ion production unit 1 and is provided with a magnet therearound (not shown in the drawings) for producing a magnetic field, by which ions of a desired mass are deflected and selectively passed through the separator. A deceleration tube 6 is connected to the terminal end of the mass separator 5. The deceleration tube 6 comprises annular or hollow cylindrical insulators 7 and electrodes 8 arranged in a multiplicity of stages and connected together. Indicated at 9 is a deceleration power supply for applying a positive voltage to each of the electrodes 8.

Figure 2:
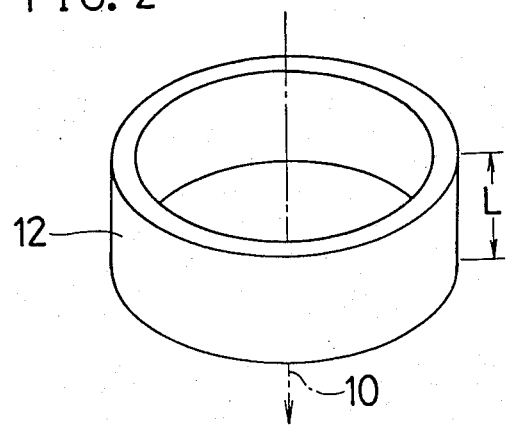
FIG. 2 is a perspective view showing an example of suppressor electrode for the apparatus of FIG. 1.

A first suppressor electrode 12 is provided within the deceleration tube 6 in the vicinity of its inlet for an ion beam, for example, at the stage portion most proximate to the inlet, of the multi-stage deceleration tube 6. The electrode 12 serves to suppress the flow of secondary electrons into the deceleration tube 6. The suppressor electrode 12 is, for example, an annular or hollow cylindrical metal electrode and is provided concentrically with the deceleration tube 6. In this case, the suppressor electrode 12, which is, for example, hollow and cylindrical as seen in FIG. 2, preferably has a length L which enables the electrode to fully suppress the flow of secondary electrons 11 into the deceleration tube 6. For example, L could range from about 20 to about 30 mm.

A suppressor power supply 13 for supplying a suppressor voltage Vc is connected between an outlet portion of the mass separator 5 and the suppressor electrode 12. The power supply 13 gives the suppressor electrode 12 a potential for suppressing the flow of secondary electrons into the deceleration tube 6, e.g., the negative potential of suppression voltage Vc, at the inlet of the deceleration tube 6.

An ion implantation unit 14 has a vacuum container 15 and a disk 16 disposed therein for placing thereon the article to be treated. Opposed to the disk 16 is a second suppressor electrode 18 to which a voltage is applied by a power supply 17. Suppressor electrode 18 is positioned between disk 16 and the inlet to vaccum container 15, so as to be substantially concentric with deceleration tube 6.

The ion implantation apparatus described above operates in the following manner.

First, a voltage $V_E$, for example, of 30 kV is applied across the ion source 2 and the extraction electrode 3, which extracts a positively charged ion beam 10 from the ion source 2. The ion beam 10 enters the mass separator 5, whereby ions of desired mass only are deflected through 90 degrees and led into the deceleration tube 6. Within the mass separator 5, the ions having masses other than the desired mass impinge on the inner wall surface of the separator 5 to produce a large quantity of secondary electrons 11 which tend to flow into the deceleration tube 6 along with the ion beam 10.

The ion extraction power supply is capable of applying a voltage between 25 to 80 kV to the ion extraction electrode; the deceleration power supply is capable of applying a voltage of between 3 to 25 kV to the deceleration tube; and the suppressor power supply is capable of applying a voltage of between 0.3 and 2 kV to the suppressor electrode.

The ion inlet of the deceleration tube 6 is given a negative potential, by the power supply 9 and 4, while the suppressor electrode 12 is negatively charged to the inlet potential by its power supply 13. When voltage $V_E$ of the power supply 9 is 10 KV, the positively charged ion beam 10 flowing into the deceleration tube 6 is decelerated by 30 KV−10 KV=20 KV, i.e., −20 KV, while passing through the tube 6 and impinges on the article to be treated and placed on the disk 16. On the other hand, the flow of secondary electrons 11 into the deceleration tube 6 is suppressed by the suppressor electrode 12 which is positioned in the vicinity of the inlet of the tube 6. The secondary electrons released from the disk 16 when the article to be treated is irradiated with the ion beam 10 are returned to the disk 16 by the secondary electron suppressing action of the suppressor electrode 18 which is maintained, for example, at a negative potential of about −600 kV by the power supply 17.

Thus, the secondary electrons 11 produced in the mass separator 5 are prevented from impinging on the disk 16 upon acceleration, so that the beam current of the ion beam 10 can be measured accurately by an ammeter 19 or the like. The accurate measurement obtained assures precise control of the ion implantation apparatus, for example, with respect to the amount of ions to be implanted.

Figure 3:
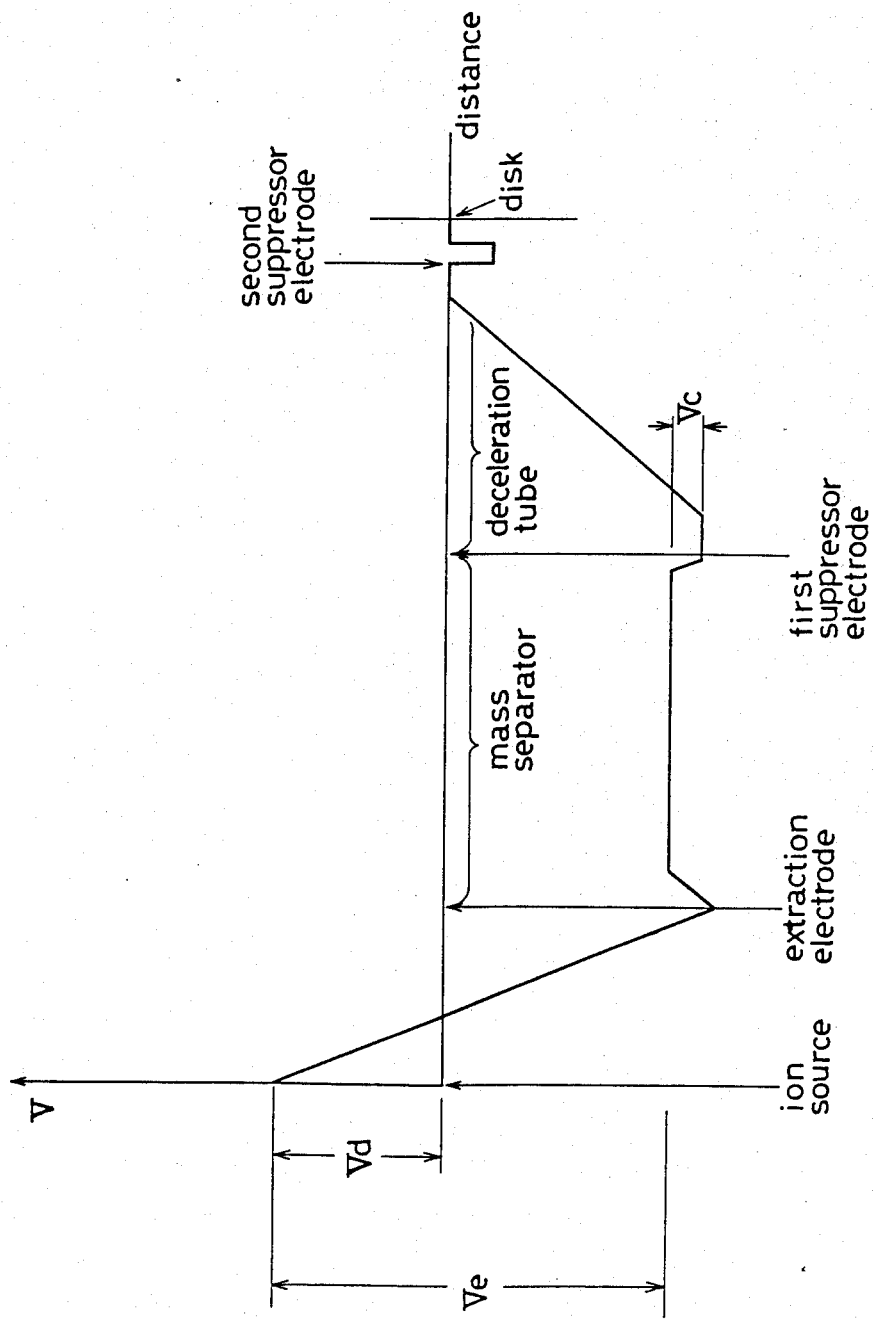
FIG. 3 is a diagram showing the potential distribution in the apparatus of FIG. 1.

FIG. 3 illustrates, in graphic form, the relationship between distance and the voltages across the elements of the ion implantation apparatus of the present invention.

Furthermore, the amount of secondary electrons 11 flowing into the deceleration tube 6 from the mass separator 5 can be controlled suitably by adjusting the suppression voltage Vc to be applied to the suppressor electrode 12. Flow of a suitable amount of secondary electrons 11 into the deceleration tube 6 acts to neutralize positive ions of high current, thereby preventing divergence of the ion beam 10. Stated more specifically, when the ion beam 10 has a high current, the positive ions repel one another because of space charge resulting in a strong tendency for the beam to diverge. However presence of a suitable amount of secondary electrons 10 in the beam diminishes the space charge to prevent the divergence of the ion beam 10. In other words, the convergence of the ion beam is adjustable by adjusting the degree of suppression of the flow of secondary electrons 11 into the deceleration tube 6 by the suppressor electrode 12, consequently permitting the ion beam 10 having a high current to readily reach the disk 16 or like target.

During use the ion implantation apparatus, discharge of the ion source is likely to occur frequently, and in such a case, it becomes necessary to alter the extraction voltage. This is likely to vary the degree of convergence of the ion beam 10 within the deceleration tube 6. Consequently, there arises a need to adjust the degree of convergence of the ion beam 10 by altering the voltage to be applied to the suppressor electrode 12 as stated above.

It is desirable to provide the suppressor power supply 13 at the outlet potential portion of the mass separator 5 because the insulation then needed is only for the suppression voltage Vc, whereby the extent of electric insulation can be diminished. Although the ion implantation apparatus described above is of the high current type for which the present invention is very effective, the present invention is similarly useful for those of the medium or low current type.

We claim:

1. An apparatus for ion implantation comprising:
   (a) an ion source;
   (b) an ion extraction electrode oppositely disposed with respect to said ion source, said electrode comprising means for extracting ions from said ion source;
   (c) an ion extraction power supply connected to said ion extraction electrode;
   (d) a mass separator for selecting desired ions from among the ions extracted from the ion source by the ion extraction electrode;

(e) a deceleration tube for receiving said desired ions from the mass separator and decelerating said desired ions;

(f) an ion deceleration power supply connected to the deceleration tube;

(g) an ion implantation unit for implanting said desired ions received from the deceleration tube into an article to be treated;

(h) a suppressor electrode disposed within the deceleration tube adjacent to an ion inlet of said deceleration tube, said electrode comprising means for suppressing the flow of secondary electrons into the deceleration tube; and (i) a suppressor power supply connected to the suppressor electrode.

2. An apparatus as defined in claim 1 wherein the suppressor electrode is in the form of a hollow cylinder adapted to be disposed concentrically with the deceleration tube.

3. An apparatus as defined in claim 2 wherein the hollow cylinder is 20 to 30 mm in length.

4. An apparatus as defined in claim 1 wherein a constant voltage is applied to the suppressor electrode by the suppressor power supply.

5. An apparatus as defined in claim 1 wherein an optional voltage is applied to the suppressor electrode by the suppressor power supply.

6. An apparatus as defined in claim 1 wherein the ion extraction power supply applies a voltage of from 25 to 80 kV to the ion extraction electrode, the deceleration power supply applies a voltage of from 3 to 25 kV to the deceleration tube, and the suppressor power supply applies a voltage of from 0.3 to 2 kV to the suppressor electrode.

7. An apparatus as defined in claim 1 wherein the deceleration tube comprises insulators and electrodes connected together in a multiplicity of stages.

8. An apparatus as defined in claim 1 wherein the ion implantation unit comprises a vacuum container, a disk disposed inside the container for placing thereon the article to be ion-implanted, and a secondary electron suppressor electrode opposed to the disk.

9. An ion implantation apparatus for implanting ions in an article, said apparatus comprising:

(a) means for supplying an ion beam to said ion implantation apparatus;

(b) means for selecting predetermined ions from said ion beam, said selecting means comprising a mass separator for receiving said ion beam and for selectively passing said predetermined ions, said selecting means being connected to said ion beam supplying means, said predetermined ions having a given mass;

(c) means for decelerating said predetermined ions, said decelerating means comprising an inlet, a deceleration tube for receiving said predetermined ions from said selecting means and for decelerating said predetermined ions, and a deceleration power supply for supplying power to said deceleration tube, said decelerating means being connected to said selecting means;

(d) means for implanting said decelerated predetermined ions in said article, said implanting means being connected to said decelerating means; and (e) first suppressing means for suppressing passage of secondary electrons of said ion beam from said selecting means to said decelerating means, said first suppressing means positioned substantially adjacent to said inlet of said decelerating means.

10. The ion implantation apparatus according to claim 9, wherein said means for supplying an ion beam to said ion implantation apparatus comprises:

(a) an ion source for producing ions;

(b) an ion extraction electrode for forming said ion beam from ions produced by said ion source; and (c) an ion source power supply for supplying power to said ion source.

11. The ion implantation apparatus according to claim 9 wherein said mass separator is angled.

12. The ion implantation apparatus according to claim 9 wherein said deceleration tube comprises a plurality of stages, each stage comprising at least one hollow cylindrical insulator and at least one electrode.

13. The ion implantation apparatus according to claim 9 wherein said implanting means comprises:

(a) a vacuum container having an inlet through which said decelerated predetermined ions pass;

(b) a disk for receiving said article to be implanted;

(c) second suppressing means positioned between said disk and said inlet to prevent secondary electrons from bouncing off of said article; and (d) second suppressing means power supply for supplying power to said second suppressing means.

14. The ion implanting apparatus according to claim 13 wherein said first and second suppressing means each comprise a suppressor electrode comprising a hollow cylinder adapted to be positioned substantially concentric to said deceleration tube.

15. The ion implanting apparatus according to claim 14 wherein said hollow cylinder of said first suppressing means has a length between 20 mm and 30 mm.

16. An apparatus in accordance with claim 1, wherein said mass separator comprises means for producing a magnetic field to deflect ions having a predetermined mass.

17. An apparatus in accordance with claim 9, wherein said mass separator comprises means for producing a magnetic field to deflect ions having a predetermined mass.

* * * * *

UNITED STATES PATENT AND TRADEMARK OFFICE
CERTIFICATE OF CORRECTION

PATENT NO. : 4,766,320

DATED : August 23, 1988

INVENTOR(S) : Masao NAITOH

It is certified that error appears in the above-identified patent and that said Letters Patent is hereby corrected as shown below:

```
        Column 1, line 12, change "Ion-Asisted" to ---
Ion-Assisted---.
        Column 1, line 48, insert --- , --- after
"Further".
        Column 1, lines 28-29, change "acclerated" to
---accelerated---.
        Column 1, line 57, insert ---and--- after
"source," and before "an".
        Column 2, line 16, insert --- the --- before
"suppressor".
        Column 3, line 6, insert ---10--- after "beam"
and before first comma.
        Column 3, line 7, delete "," after "inlet".
        Column 4, line 32, insert ---10--- after "beam"
and before "is".
```

Signed and Sealed this

Twenty-fourth Day of July, 1990

Attest:

HARRY F. MANBECK, JR.

*Attesting Officer*      *Commissioner of Patents and Trademarks*